United States Patent
Korenaga et al.

[19]

[11] Patent Number: 6,157,159
[45] Date of Patent: Dec. 5, 2000

[54] STAGE SYSTEM AND EXPOSURE APPARATUS USING THE SAME

[75] Inventors: Nobushige Korenaga, Utsunomiya; Shuichi Yabu, Kawasaki, both of Japan

[73] Assignee: Canon Kabushiki Kaisha, Tokyo, Japan

[21] Appl. No.: 09/240,846

[22] Filed: Feb. 1, 1999

[30] Foreign Application Priority Data

Feb. 3, 1998 [JP] Japan .................................. 10-021913

[51] Int. Cl.[7] ................................................ B64C 17/06
[52] U.S. Cl. .............................. 318/649; 318/35; 318/51; 318/90; 318/160; 108/20; 248/562; 414/936
[58] Field of Search .............................. 318/649, 35, 39, 318/51, 53–64, 66–67, 90–97, 135, 159–160, 434; 108/20–22; 248/562–566; 414/935–941

[56] References Cited

U.S. PATENT DOCUMENTS

| | | | |
|---|---|---|---|
| 4,764,815 | 8/1988 | Landsman | 358/293 |
| 5,467,720 | 11/1995 | Korenaga et al. | 108/20 |
| 5,504,407 | 4/1996 | Wakui et al. | 318/592 |
| 5,518,550 | 5/1996 | Korenaga et al. | 118/729 |
| 5,726,542 | 3/1998 | Ebihara | 318/35 |
| 5,841,250 | 11/1998 | Korenage et al. | 318/135 |
| 5,874,820 | 2/1999 | Lee | 318/575 |
| 6,037,680 | 3/2000 | Korenaga et al. | 318/135 |

FOREIGN PATENT DOCUMENTS

8-037151  2/1996  Japan .

*Primary Examiner*—David Martin
*Attorney, Agent, or Firm*—Fitzpatrick, Cella, Harper & Scinto

[57] ABSTRACT

A stage system includes a stage movable along a path, a first driving mechanism for accelerating or decelerating the stage on the basis of a resilience force of a resilient member, a first holding mechanism for holding a resilience force being accumulated through compression of the resilient member of the first driving mechanism, and a second holding mechanism for holding a resilience force being accumulated through extension of the resilient member of the first driving mechanism, wherein resilience energy of the resilient member is used for stage acceleration, which is very effective to prevent large heat generation, and wherein resilient energy accumulated in the resilient member during deceleration is used for subsequent stage acceleration, which is very effective for energy efficiency and for heat generation suppression.

18 Claims, 8 Drawing Sheets

STAGE SYSTEM AND EXPOSURE APPARATUS USING THE SAME

FIELD OF THE INVENTION AND RELATED ART

This invention relates to a stage system for carrying and positioning a workpiece. More particularly, the invention is concerned with a stage system suitably usable in a reticle stage system of a scan type exposure apparatus wherein a pattern of a reticle is printed on a wafer while scanningly moving the reticle and the wafer. In another aspect, the invention relates to an exposure apparatus or a device manufacturing method, using such a stage system.

Figure 8:
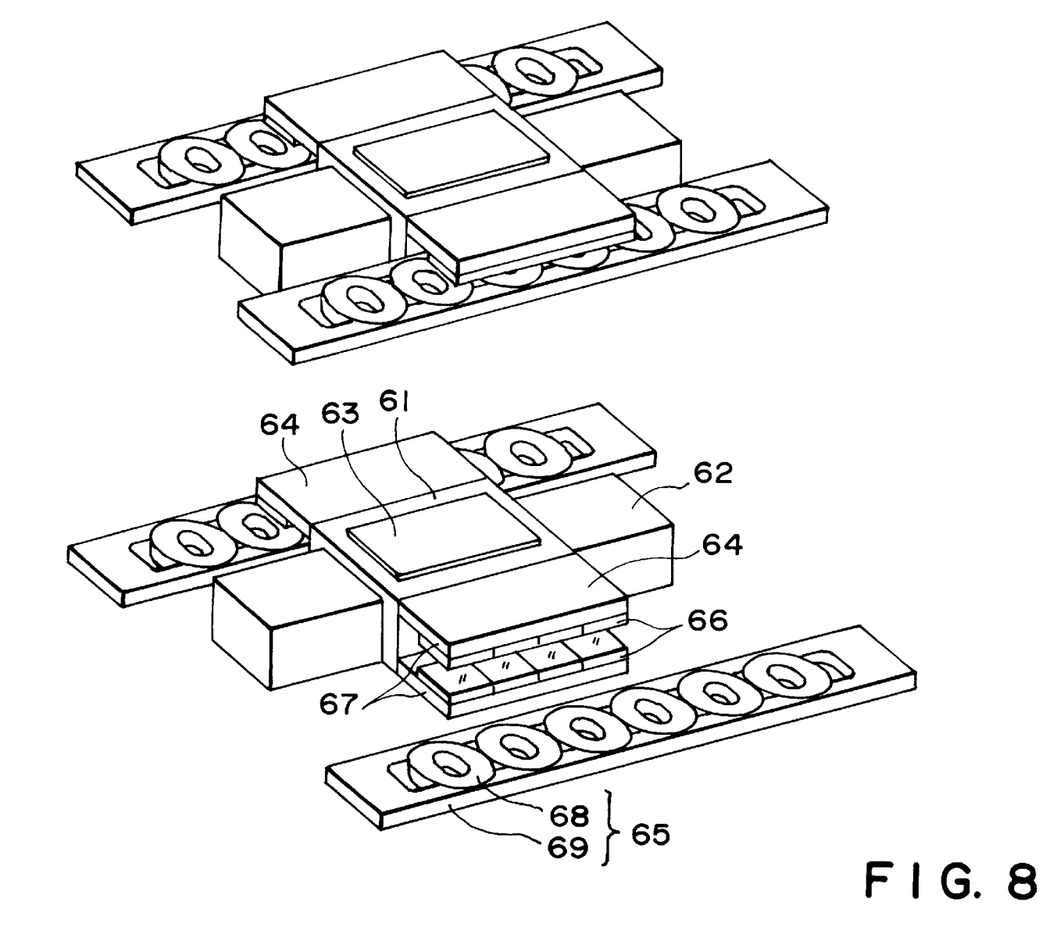
FIG. 8 is a schematic view of a known type stage system.

FIG. 8 is a schematic view of a known example of a stage system having a linear motor.

A guide 62 is fixedly mounted on a base, not shown. A stage 61 carries thereon a workpiece 63, and it is supported by the guide 62 slidably in one axial direction. Mounted on the opposite sides of the stage 61 are linear motor movable elements 64 each of which is disposed opposed to a linear motor stator 65 without contact thereto. The linear motor stators 65 are fixedly mounted on the base, not shown.

Each linear motor movable element 64 comprises a pair of upper and lower integral structures each having four-pole magnets 66 and a yoke 67 for circulation of magnetic flux. The linear motor stators 65 (six in this example) each comprises a plurality of coils disposed in an array and held fixed by a stator frame 69.

A linear motor corresponds to an expanded type of an ordinary brushless DC motor, wherein driving coils and electric current directions are changed in accordance with the relative positional relation between magnets and coils, whereby a desired force is produced in a desired direction.

In the structure described above, in a state in which the stage 61 is held stationary, an electric current is applied to a predetermined linear motor coil or coils 68 in a predetermined direction and for a predetermined time, to accelerate the stage 61. After a predetermined speed is reached, acceleration is interrupted, and a procedure such as exposure or inspection is performed. After an elapse of a constant speed period, an electric current is applied to a predetermined linear motor coil or coils 68, to decelerate and stop the stage.

The stage position is measured by means of a high precision position sensor such as a laser interferometer, not shown. Separately from acceleration and deceleration, an electric current is applied to linear motor coils to remove a positional error with respect to a desired position such that, irrespective of an acceleration period, a deceleration period, and a constant-speed period, high speed and high precision position control is performed.

When the linear motor is energized and if the acceleration speed is made larger for improved stage performance, larger heat generation results therefrom. Therefore, components around the workpiece may deform due to thermal expansion, or a measurement reference may deform due to thermal expansion. Also, the air density along the light path of the laser interferometer may be disturbed, causing degradation of the measurement precision. These are factors for lowering the workpiece positioning precision of the stage system.

SUMMARY OF THE INVENTION

It is an object of the present invention to provide a stage system by which heat generation during acceleration or deceleration of a stage is reduced.

In accordance with an aspect of the present invention, there is provided a stage system, comprising: a stage movable along a path; a first driving mechanism for accelerating or decelerating said stage on the basis of a resilience force of a resilient member; a first holding mechanism for holding a resilience force being accumulated through compression of said resilient member of said first driving mechanism; and a second holding mechanism for holding a resilience force being accumulated through extension of said resilient member of said first driving mechanism.

In one preferred form of this aspect of the present invention, the stage system may further comprise a second driving mechanism for applying a driving force to said stage.

The second driving mechanism may serve to control one of position and speed of said stage.

The second driving mechanism may serve to control one of position and speed of said stage in an acceleration region, a deceleration region and a constant speed region of said stage.

The first driving mechanism may include a spring.

The first driving mechanism may include components disposed at opposite end portions of the path.

The first driving mechanism may include a pusher for contacting said stage to transmit the resilience force thereto.

The first and second holding mechanisms may serve to release holding of said pusher at a desired timing.

The second holding mechanism may serve to release the holding so that, after release of the holding, said pusher and said stage contact at substantially the same speed.

The pusher and said stage may contact at a position about a natural length of said resilient member compressed or extended.

Each of said first and second holding mechanisms may include an electromagnetic clutch.

The stage system may further comprise a displacement mechanism for compressing or extending said resilient member to produce the resilience force.

The displacement mechanism may include a feed screw.

The second driving mechanism may include a linear motor.

In accordance with another aspect of the present invention, there is provided an exposure apparatus, comprising: a stage movable along a path; a first driving mechanism for accelerating or decelerating said stage on the basis of a resilience force; a first holding mechanism for holding a resilience force being accumulated through compression by said first driving mechanism; and a second holding mechanism for holding a resilience force being accumulated through extension by said first driving mechanism.

The stage may serve to hold a reticle thereon and to scanningly move it.

In accordance with a further aspect of the present invention, there is provided a device manufacturing method, comprising the steps of: providing an exposure apparatus having (i) a stage movable along a path, (ii) a first driving mechanism for accelerating or decelerating said stage on the basis of a resilience force, (iii) a first holding mechanism for holding a resilience force being accumulated through compression by said first driving mechanism, and (iv) a second holding mechanism for holding a resilience force being accumulated through extension by said first driving mechanism; and transferring a pattern of a reticle onto a wafer.

The method may further comprise applying a resist to the wafer before exposure thereof, and developing the wafer after the exposure.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Embodiment 1

Figure 1:
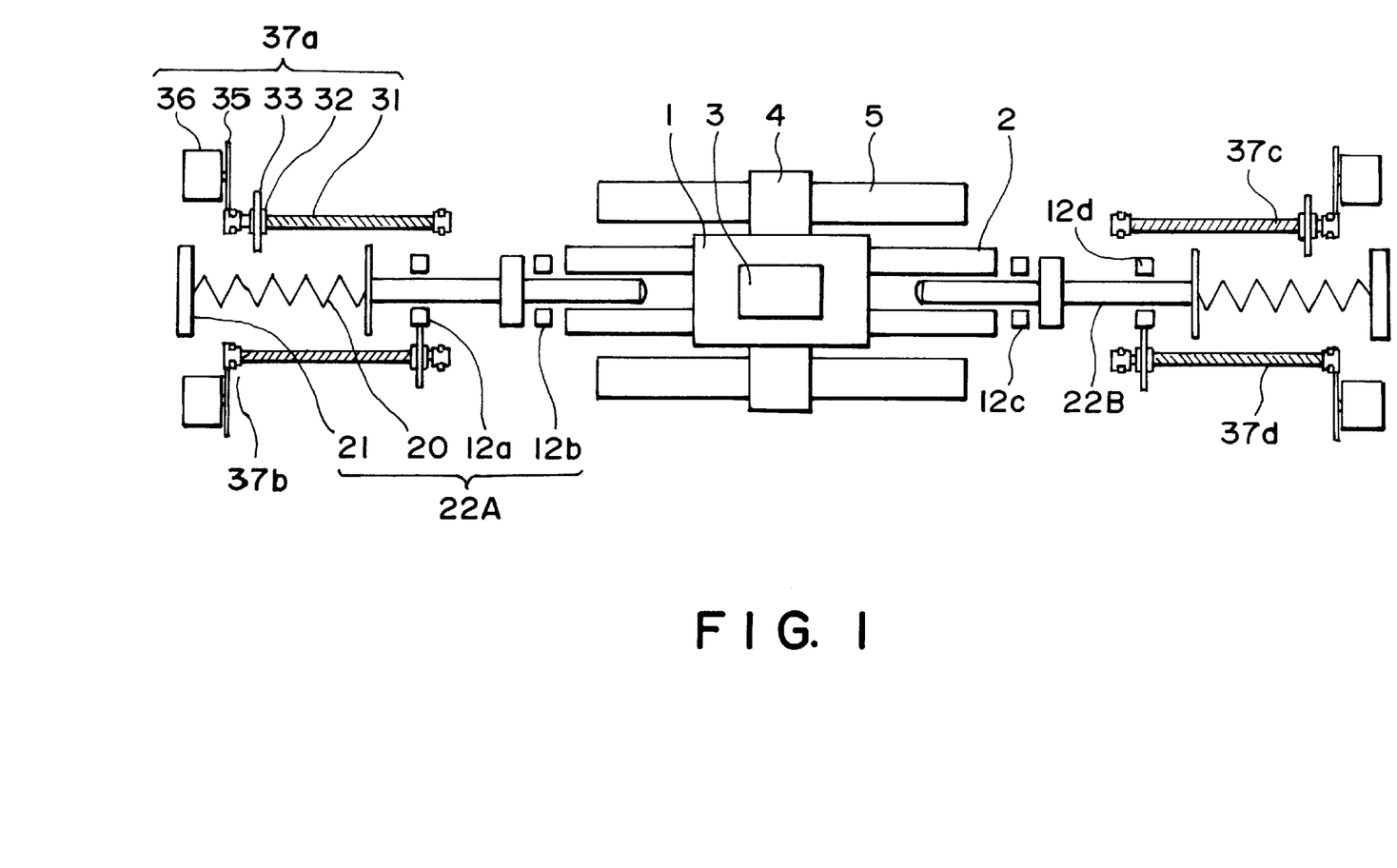
FIG. 1 is a schematic view of a stage system according to a first embodiment of the present invention.

FIG. 1 shows a stage system according to a first embodiment of the present invention.

A guide 2 is fixedly mounted on a base, not shown. A stage 1 carries thereon a workpiece 3, and it is supported by the guide 2 slidably in one axial direction. Mounted on the opposite sides of the stage 1 are linear motor movable elements 4 each of which is disposed opposed to a linear motor stator 5 without contact thereto. The linear motor stators 5 are fixedly mounted on the base, not shown.

Each linear motor movable element 4 comprises a pair of upper and lower integral structures each having magnets and a yoke for circulation of magnetic flux. The linear motor stators 5 each comprises a plurality of coils disposed in an array and held fixed by a stator frame. In this embodiment, the linear motor provides a thrust producing mechanism (second driving mechanism) for controlling constant speed movement of the stage 1, and, therefore, a large thrust is not always necessary. Thus, it may not be a multi-phase linear motor having plural coils arrayed, but it may be a single-phase linear motor.

A control system for this linear motor includes a software or hardware electric current limiter for preventing flow of excessive electric current, causing large heat generation.

As illustrated, there are spring acceleration and deceleration driving mechanisms 22 (first driving mechanism) at opposite ends of the running path of the stage 1, for acceleration and deceleration of the stage 1. Disposed on the opposite sides of each spring acceleration and deceleration driving mechanism 22 are initialization units 37 (displacement mechanism).

A guide clutch 12 is fixedly mounted on a base, not shown. Denoted at 11 is a pusher supported by the guide clutch 12 through an air bearing 15, slidably in the stage movement direction. In this embodiment, the resilient member comprises a spring. Denoted at 21 is a spring base fixedly mounted on a force support, not shown. An end of the coil spring 20 is connected to the rear end of the pusher 11, and the other end of the spring is connected to the spring base 21.

Each spring acceleration and deceleration driving mechanism 22 is mainly composed of guide clutch 12, pusher 11 and spring base 21.

Figure 2:
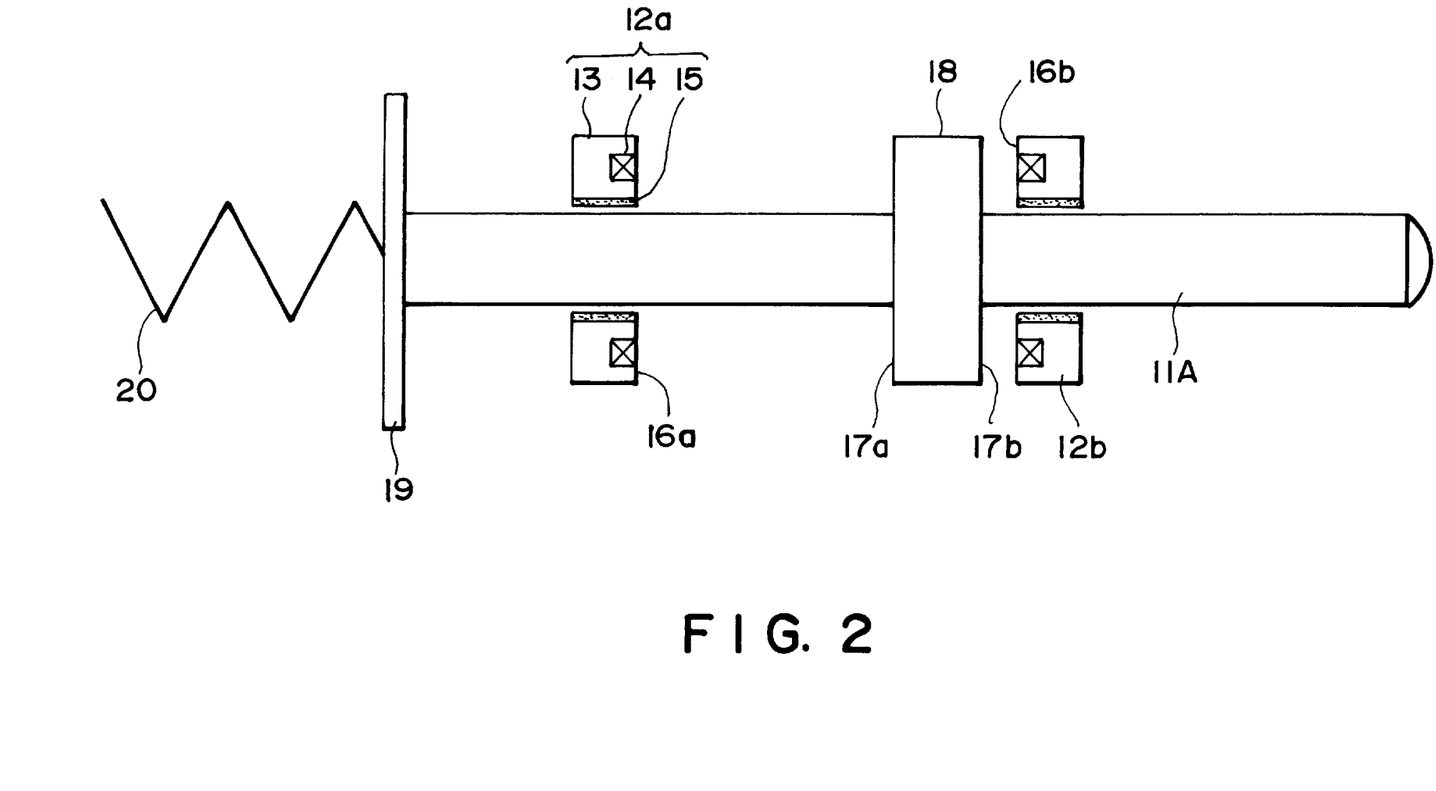
FIG. 2 is a schematic view for explaining details of an acceleration and deceleration mechanism used in the stage system of the first embodiment.

FIG. 2 illustrates the spring acceleration and deceleration driving mechanism, in detail. The pusher 11 comprises a columnar rod having a rounded free end, and it has a magnetic collar 18 of a ring-like flange shape, provided at a middle portion of the rod. The magnetic collar 18 is made of a magnetic material such as iron, for example. At a rear portion of the columnar rod, there is a disk-like initialization collar 19 which is connected to the coil spring 20. Two flat portions of the magnetic collar 18 define surfaces to be attracted by guide clutches 12, to be described later. A rounded free end of the rod is adapted to contact the stage 1 to transmit thrust thereto. Each guide clutch 12 has a ring-like shape. Air pad 15 is provided at the inner cylindrical surface of the clutch, by which an air slide is provided between it and the pusher 11 of the columnar rod. Thus, at the inside cylindrical surface of the guide clutch 12, the pusher 11 of the columnar rod is supported slidably in the stage movement direction. The guide clutch 12 is mainly made of a magnetic material, and an annular groove is formed thereon. Annular coil 14 is disposed in this annular groove. When an electric current is applied to the coil 14, the magnetic material functions as a yoke 13 for passing a large magnetic flux. The yoke 13 has a channel-shaped section, and two protruded portions of the channel shape serve as an attraction surface 16 for attracting the magnetic collar 18. In response to a supply of electric current to the annular coil 14, a magnetic flux circulates around the coil 14 and through the channel-shaped section. At the two protruded portions of the channel shape, the magnetic flux leaks through the air. As the surface 17 to be attracted of the magnetic collar 18 is brought into contact with the attraction surface 16 of the guide clutch 12, the coil 14 is fully surrounded by all magnetic material members. Thus, a large magnetic flux passes, such that the magnetic collar 18 is attracted to the guide clutch 12 by a large force. Attraction surfaces 16 of two guide clutches 12 for guiding the pusher 11 are disposed opposed to each other, so that the magnetic collar 18 of the pusher 11 can be held at two positions.

Initialization units 37 disposed at opposite sides of the spring acceleration and deceleration driving mechanism 22, each comprises a motor 36 fixedly mounted on a base, not shown, a feed screw 31 which can be driven through a decelerator having large and small gears 35, a bearing 34 for supporting the feed screw 31, a ball nut 32 movable rectilinearly through the feed screw 31, and a collar pushing element 33 mounted on the ball nut 32. The initialization unit 37 is operable in response to rotation of the motor 36 to move the ball nut 32 and the collar pushing element 33 in the stage 1 movement direction. As the collar pushing element 33 is brought into contact with the initialization collar 37 provided at the rear portion of the pusher 11, a force is transmitted thereto to cause compression or extension of the spring 20 against the spring force, by which the pusher 11 is moved to a desired position.

Figure 3:
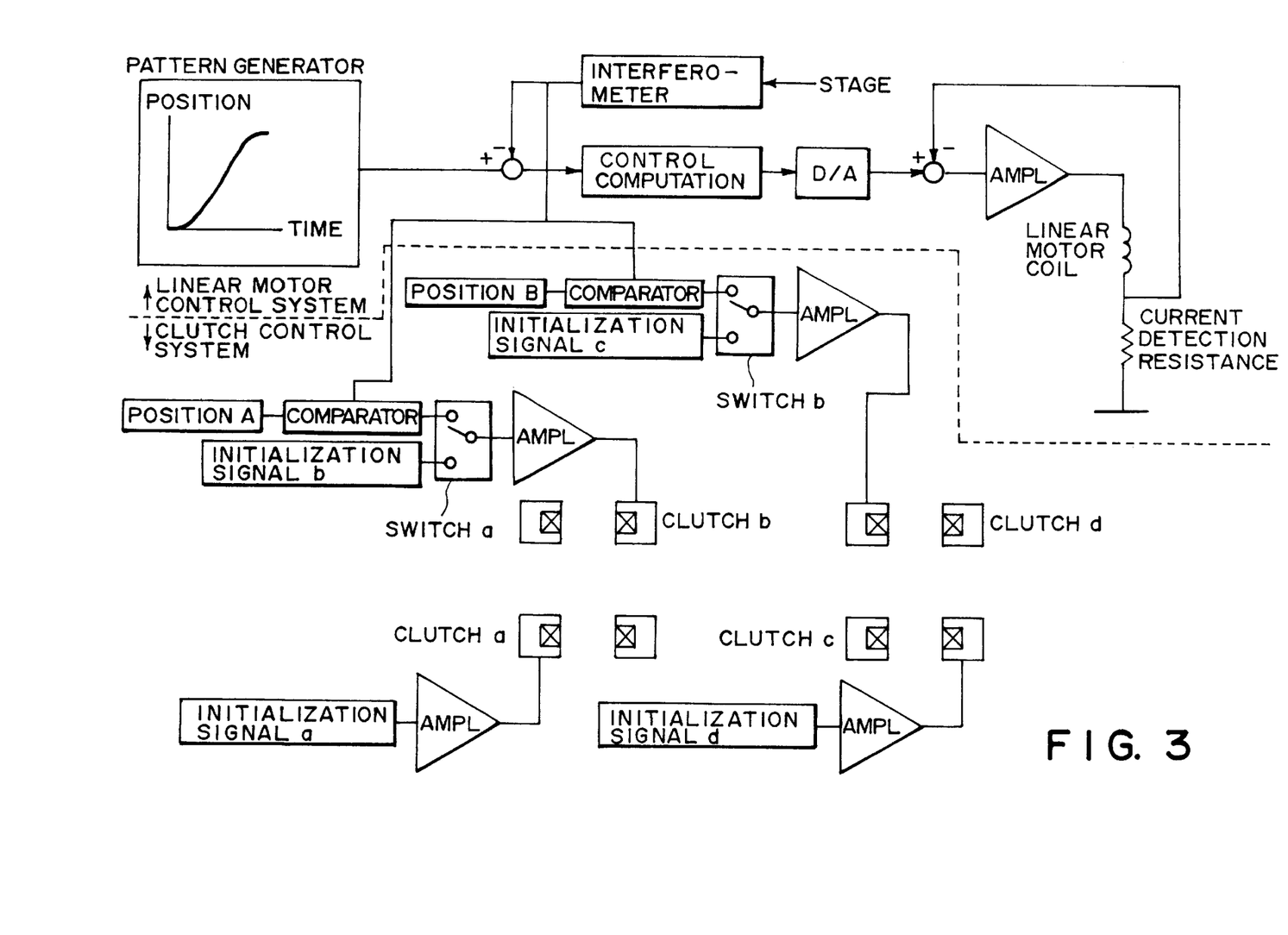
FIG. 3 is a block diagram of a control system in the stage system of the first embodiment.

FIG. 3 is a block diagram of a control system. On the opposite sides of the boundary depicted by a broken line, there are a linear motor control system and a clutch control system. Although not shown in the drawing, there is an initialization unit motor control system.

The linear motor control system is an ordinary position control system wherein control computation is made on the basis of a difference between the position designation produced by a pattern generator and the stage position measured by a laser interferometer (not shown), whereby current designation is produced, and wherein a linear motor amplifier is actuated to provide a desired electric current. Since, as described, there is a limiter to electric current, provided inside the control system, no electric current is applied that may cause large heat generation. As a result of this, the linear motor control system substantially functions only when the difference between a measured value of the interferometer and the position designation by the pattern generator is small.

The clutch control system serves to control currents to four clutches in accordance with the stage position or the state of initialization. A control system connected to clutches a and d functions to control the clutch electric current in response to an initialization signal, to be described later. A control system connected to clutches b and c functions to alternately operate for a case where clutch current is controlled in response to an initialization signal to be described later and a case where the positional relation between the set position and the stage is compared by use of a comparator and, on the basis of the result of it, the clutch current is controlled.

The initialization unit motor control system (not shown) serves to actuate the motor in the initialization, to move the pusher to a predetermined position through the collar pushing element of the feed screw and the initialization collar of the pusher.

The operation in the above-described structure will be described with reference to FIGS. 4A–4H.

Figures 4A, 4B:
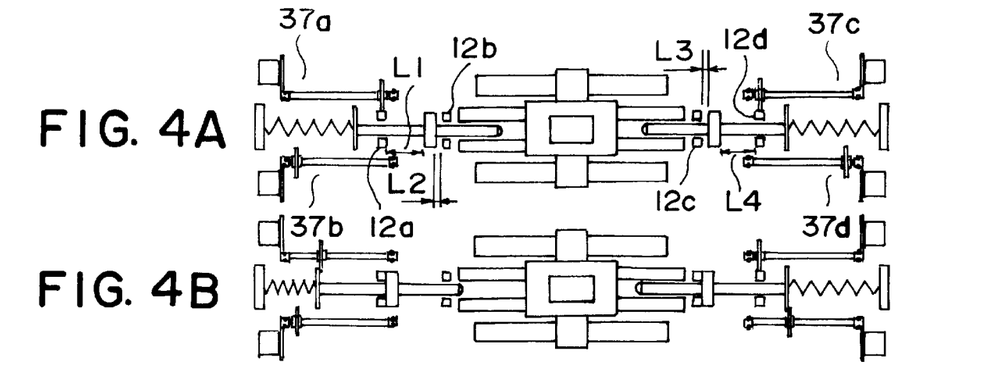
FIGS. 4A–4H are schematic views, respectively, for explaining operation of the stage system of the first embodiment.

FIG. 4A shows an initial state or a state in which the power source is just turned on. The stage is at a proper position, and the electric current for the linear motor is being controlled to zero. Further, initialization of a laser interferometer (not shown) with respect to its reference has been accomplished, such that it has been prepared for measurement of an absolute position with respect to a mechanical reference. A description will be made below, while taking the rightward direction as a positive direction. Further, since the coil spring 14 is in its natural length state, no spring force acts on the pusher 11 in each of front and rear acceleration and deceleration driving mechanisms. Here, the distance $L_1$ between the surface 17a to be attracted of the magnetic collar of the pusher 11A and the attraction surface 16a of the guide clutch 12a (first holding mechanism) is set to be larger than the distance $L_2$ between the surface 2 to be attracted of the magnetic collar of the pusher A and the attraction surface 2 of the guide clutch 12a.

If the mass of the pusher is ma the movable mass of the stage is M, the equivalent mass of the spring is b, the spring constant of the spring is k, and the speed to be reached by the stage through acceleration by the spring is v, then the components are so set that the following relations are substantially satisfied:

$$k(L_1)^2/2=(m+b+M)v^2/2$$

$$k(L_2)^2/2=(m+b)v^2/2$$

To this end, a relation $L_1>L_2$ is selected.

This is also the case with the sizes $L_3$ and $L_4$ around the pusher B of the spring acceleration and deceleration driving mechanism B. The initial position refers to a state in which the stage stands by outside the stroke range of the pusher so that it does not interfere with the reciprocal motion of the pusher. At this time, in the clutch control system, the control system connected to the clutches 2 and 3, is placed in a mode in which it is able to control the clutch electric current in response to an initialization signal.

Subsequently, the initialization unit motor control system (not shown) actuates the motor of the initialization unit a so that a force is transmitted from the nut and the collar pushing element to the pusher 11A through the initialization collar 19 of the pusher 11A. In response, the spring 20 is compressed until the attraction surface 16a of the guide clutch 12a and the surface 17a to be attracted of the magnetic collar come sufficiently close to each other. As the attraction surface 16a of the guide clutch 12a and the surface 17a to be attracted of the magnetic collar 18a come sufficiently close to each other, the initialization signal a of the clutch control system is made active, such that an electric current is applied to the coil of the guide clutch 12a. In response, the surface 17a of the magnetic collar is attracted to the attraction surface 16a of the guide clutch 12a.

On the other hand, in the spring acceleration and deceleration driving mechanism 22B, the initialization unit motor control system (not shown) actuates the motor of the initialization unit 37d so that a force is transmitted from the nut and the collar pushing element to the pusher 11B through the initialization collar 19 of the pusher 11B. In response, the spring is compressed until the attraction surface 16c of the guide clutch 12c (second holding mechanism) and the surface 16c to be attracted of the magnetic collar come sufficiently close to each other. At this moment, the control system connected to the guide clutch 12c is being placed in a mode for controlling the electric current in response to an initialization signal c, as described above. Then, in response to the initialization signal a, signal d is turned on, and an electric current is applied to guide clutch 12d. As the surface to be attracted comes sufficiently close to the attraction surface 16c of the guide clutch 12c, it is attracted to the latter.

As the above-described operation is accomplished, then the switches a and b connected to the guide clutches 12b and 12c of the clutch control system are turned to the mode for controlling the electric current in accordance with the magnitude relation between the stage position and the set position. Here, the control system connected to the clutch 12b is so arranged that an electric current is supplied when a measured value of the interferometer is larger than the position A±tolerance, to be described later, while the control system connected to clutch 12c is so arranged that an electric current is supplied when a measured value of the interferometer is larger than the position B±tolerance, to be described later. At the present state, the measured value of the interferometer is smaller than position A and position B, so that the electric current to the clutch 12b is kept turned off, while the electric current to the clutch 12c is turned on. FIG. 4B illustrates the state in which the above-described operation is completed.

Figure 4C:
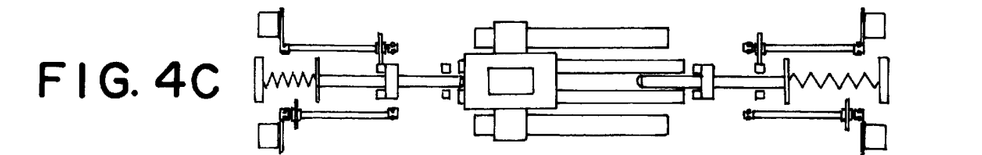

Subsequently, an initialization signal is applied to the pattern generator of the linear motor control system to move the stage 1 so that the stage side face is brought into contact with the rounded free end of the pusher 12a.

Simultaneously, the initialization unit motor control system operates to move the motors of the initialization units 37a and 37d back to their initial positions. This allows motion of the pusher 11 within its stroke by the resilience energy of the spring. Since, in this state, the pushers 11A and 11B are attracted to the guide clutches 12, they do not move even if the collar pushing element 33 of the initialization unit 37 is retracted. FIG. 4C illustrates this state.

Subsequently, a movement pattern such as shown in FIG. 3 is applied in time series to the pattern generator. Initial and end curved portions correspond to acceleration and deceleration periods, and the middle straight portion corresponds to a constant speed motion period. At the timing as the data for the initial curved portion is applied, initialization signals for the guide clutches 12a–12d are turned off. Until the stage 1 is stopped thereafter, the initialization signals a–d are kept off. In response, the electric current to the clutch 12a is turned off, and the holding of the pusher 11A is released. As a result, the resilience energy accumulated in the spring 20 is transmitted to the stage, being in contact with the pusher, such that the pusher 11 and the stage 1 move together with the spring 20 to start acceleration. Since the motion can be predicted from the masses of the pusher and stage, the linear density of the spring, and the spring constant of the spring, the pattern at the curved portion is generated in accordance with it.

Figure 4D:
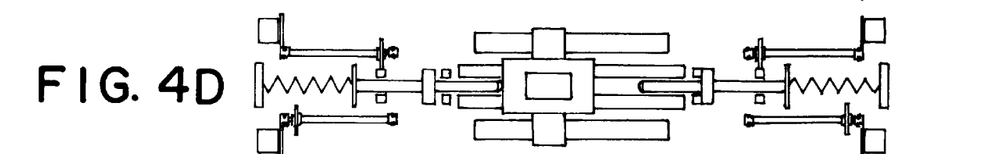

FIG. 4D shows the state in which acceleration through the spring is completed and in which the spring is placed in its natural length. Here, the speed of the pusher 11, the stage 1 and the free end of the spring 20 is about at the target speed, and the stage position is approximately at the value of the curved end portion of the pattern generator. As regards the positional difference, the stage position and the pattern generator value become close to each other, and it comes into the range of the limiter of the linear motor control system. In response, the linear motor control system is made substantively effective. After this, since the stage 1 is in the substantially constant speed motion until deceleration, in the linear motor control system, high precision position control can be made by use of an electric current that does not cause large heat generation.

The position of the stage 1 at this moment is still smaller than the position A or position B, and the electric current to the clutch 2 is kept turned off while the electric current to the clutch 3 is kept turned on. Thereafter, the stage performs constant speed motion while high precision position control is made through the linear motor. In response to application, to the spring free end and the pusher, of a force in an opposite direction due to extension of the spring from its natural length, deceleration motion starts. As a result, the pusher and the stage separate from each other at the position of the natural length of the spring.

The motion of the spring free end and the pusher 11 is determined directly from the linear density of the spring and the speed at the natural length, as well as the mass of the pusher and the spring constant of the spring. After a time $\tau$ is passed, the spring speed comes to zero in the state being extended by $L_2$ from the natural length. This corresponds to the length determined by the aforementioned equation:

$$k(L_2)^2/2 = (m+b)v^2/2$$

and it represents the state in which the kinetic energy of the spring and pusher held at the FIG. 4D state has been transformed into resilience energy of the spring.

Figure 4E:
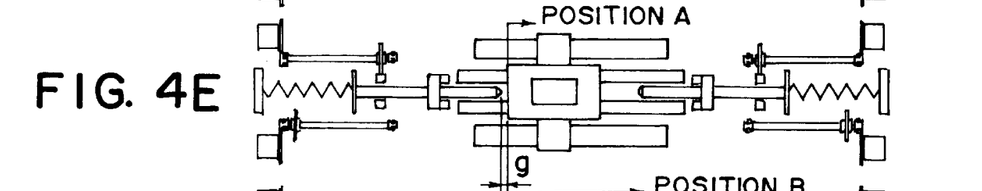

FIG. 4E shows this state. Here, the stage has advanced by $v\tau$ from the FIG. 4D state. If the gap between the pusher free end and the stage side face is g, $$v\tau = L_2 + g$$

is satisfied. The absolute position of the stage with respect to the mechanical reference, at this moment, is defined as position A.

The control system for the clutch 12b (second holding mechanism) is arranged so that an electric current is supplied if the measured value of the interferometer is larger than the position A±tolerance. Therefore, in this state, the electric current to the clutch 12b is turned on, and the attraction surface 16b of the clutch 12b attracts and holds the surface 17b of the magnetic collar of the pusher 11a. On the other hand, as regards the clutch 12c, it is arranged so that an electric current is supplied if the measured value of the interferometer is smaller than the position B±tolerance. Thus, the current is kept turned on, and the pusher 11B is held attracted.

Figure 4F:
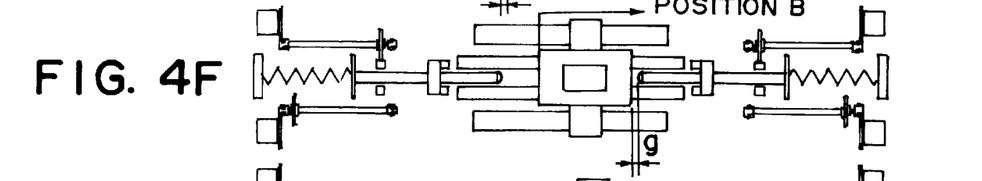

FIG. 4F shows the state in which, as the stage 1 moves more, the gap between the stage right-hand side face and the pusher 11B free end becomes equal to g. The stage position at this moment is defined as position B.

The control system for the clutch 12c (second holding mechanism) is arranged so that an electric current is supplied when the measured value of the interferometer is smaller than the position B±tolerance. In other words, if the measured value of the interferometer is larger than the position B±tolerance, the electric current is interrupted. Therefore, at this moment, attraction between the clutch 12c and the pusher 11B is released, and the pusher 11B starts acceleration with the spring force.

If, at this moment, the electric current to the clutch 12c is turned off, after time $\tau$ is passed the speed of the pusher 11B and the free end of the spring 20 reaches the stage speed v. On the other hand, the relation $v\tau = L_2 + g$ still applies even at this position. Thus, as the electric current to the clutch 12c is turned off at this moment, then, after time $\tau$ is passed, the right-hand side face of the stage and the free end of the pusher 11B contact with each other, at the same speed v and at the same position. This position is substantially the same as the position of the natural length of the spring.

Figure 4G:
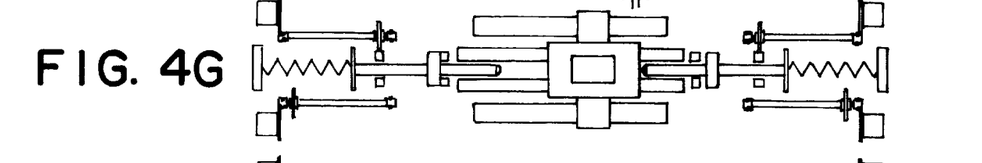

FIG. 4G shows the state in which the stage right-hand side face and the free end of the pusher 11B contact again at the same speed v. The spring of the pusher 11B is in its natural length, and thereafter the stage is decelerated by the spring force. Further, the distance between the surface 17d to be attracted of the magnetic collar of the pusher 11B and the attraction surface 12d of the clutch 12d (first holding mechanism) is $L_4$. Here, the following relation is approximately satisfied:

$$k(L_4 9^2/2 = (m+b+M)v^2/2$$

The electric current to the clutch 2 is kept turned on, and the pusher 11a is being held by the clutch 12b.

Figure 4H:
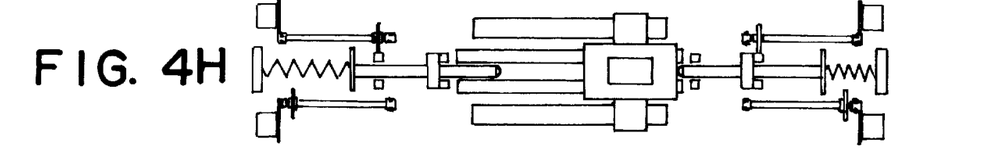

FIG. 4H shows a state in which deceleration by the spring has advanced, in which the kinetic energy of the stage 1, the pusher 11B and the spring 20 in the FIG. 4G state has transformed into resilience energy of the spring, and in which the speed of stage 1, the pusher 11B and the spring 20 has become equal to zero. As described, the following relation applies approximately:

$$k(L_4 9^2/2 = (m+b+M)v^2/2$$

and, therefore, when the speed of the stage 1, the pusher 11B and the spring 20 becomes equal to zero, the surface 17d to be attracted of the magnetic collar of the pusher 11B and the attraction surface 16d of the clutch 12d are being substantially in contact with each other. At this moment, the electric current to the clutch 12d is kept turned off, and from here, acceleration of the stage 1 by the spring force starts again. The operations following this correspond to those of FIGS. 4C–4H, as inverted laterally, and they are repeated until the stage 1 is stopped. In order to avoid collision of the magnetic collar and the clutch 12d, due to an error of position, as the speed comes to zero, the clutch 12d (or 12a) may be held stood by for a while at a side opposite to the stage 1, during reciprocal motion of the stage 1.

Among FIGS. 4A–4H, the state of FIGS. 4C–4D corresponds to an acceleration period of the stage. The state of FIGS. 4D–4G corresponds to a constant speed period of the stage. The state of FIGS. 4G–4H corresponds to a deceleration period.

To stop the stage 1 during its reciprocal motion, at the state of FIG. 4C or 4H, the electric current to the clutches 12a and 12d is turned on. In response, the pusher 11 and the spring 20 are held at this position, and also the stage 1 is stopped approximately at that position since the speed thereof is substantially zero. After this, in accordance with the procedure of FIGS. 4A, 4B and 4C, but in opposite sequence, the spring 20 being flexed is returned to its initial shape by use of the initialization unit 37. The stage is moved back to it s center position, by the linear motor.

As described above, an acceleration and deceleration driving mechanism with a spring is provided with a mechanism which functions to hold a spring 20 being extended after separation of the spring and the stage, and also to release the holding at an appropriate timing. This enables that even in the deceleration the spring system and the stage can be brought into contact with each other at the same speed. As a result of this, independently of the natural vibration frequency of the mass system and the spring, in other words, at any desired period, periodic motion of acceleration and deceleration through the spring is accomplished. This effectively avoids the problem of a linear motor during acceleration and deceleration. Further, resilience energy of the spring is accumulated during stage deceleration, and this resilience energy can be utilized in the subsequent stage acceleration. Thus, the energy efficiency is improved significantly.

In the stage system described above, if the operational region of the linear motor, having been used for control of position or speed during the constant speed period, is expanded to the acceleration period and/or deceleration period, the position or speed control can be performed also in the acceleration or deceleration period. This is effective to reduce a positional error of the stage as the stage shifts from the acceleration period to the constant speed period. Thus, position or speed control can be made at higher precision.

The initialization unit in this embodiment uses a motor and a feed screw. However, provided that the pusher can be moved against the spring, any mechanism may be used. It is not limited to the combination of the motor and feed screw. A hydraulic or pneumatic mechanism may be used, for example.

In this embodiment, the function for pushing the initialization collar of the pusher and for compressing the spring and the function for extending the spring are separated from each other, and thus, each acceleration and deceleration driving mechanism includes two initialization units. However, if any appropriate connecting and disengaging mechanism is provided between the initialization unit and the pusher, then only one initialization unit is necessary for each acceleration and deceleration driving mechanism. Namely, regarding the number of initialization units, it may be sufficient to use at least two units at the opposite ends of the running path of the stage, respectively.

As regards the control of the clutches 12b and 12c, the example described above is that the electric current is turned on only when the stage is between the position A and the position B. However, what is important is the timing for turning the electric current off. Thus, basically the current to clutches 12b and 12c may be normally kept on, and it may be turned off for a small time period from the moment whereat the stage goes out of the range between the position A and position B. On that occasion, as the pusher comes close to the clutch 12b and 12c, it is assuredly attracted. The reliability of holding is thus improved, because there is no possibility of response delay of electric current due to the attraction.

The clutches 12a–12d are not limited to electromagnetic clutches, as in the present embodiment, but they may be of any suitable type provided that it has a function for holding and releasing the pusher. For example, a combination of a mechanical latchet mechanism for holding the pusher and a driving mechanism for releasing the latchet mechanism, may be used.

The acceleration and deceleration driving mechanism for providing stage acceleration and deceleration uses resilience energy of the coil spring. However, provided that the resilience energy can be accumulated, the shape or material is not limited. For example, stage acceleration and deceleration can be provided by use of an air spring based on a pneumatic cylinder, for example.

The shape of the pusher and the guide mechanism are not limited to those of the present embodiment. A member at the free end of the spring and to be contacted to the stage, as well as a structure for guiding that member in one axial direction, are only necessary.

Embodiment 2

Figure 5:
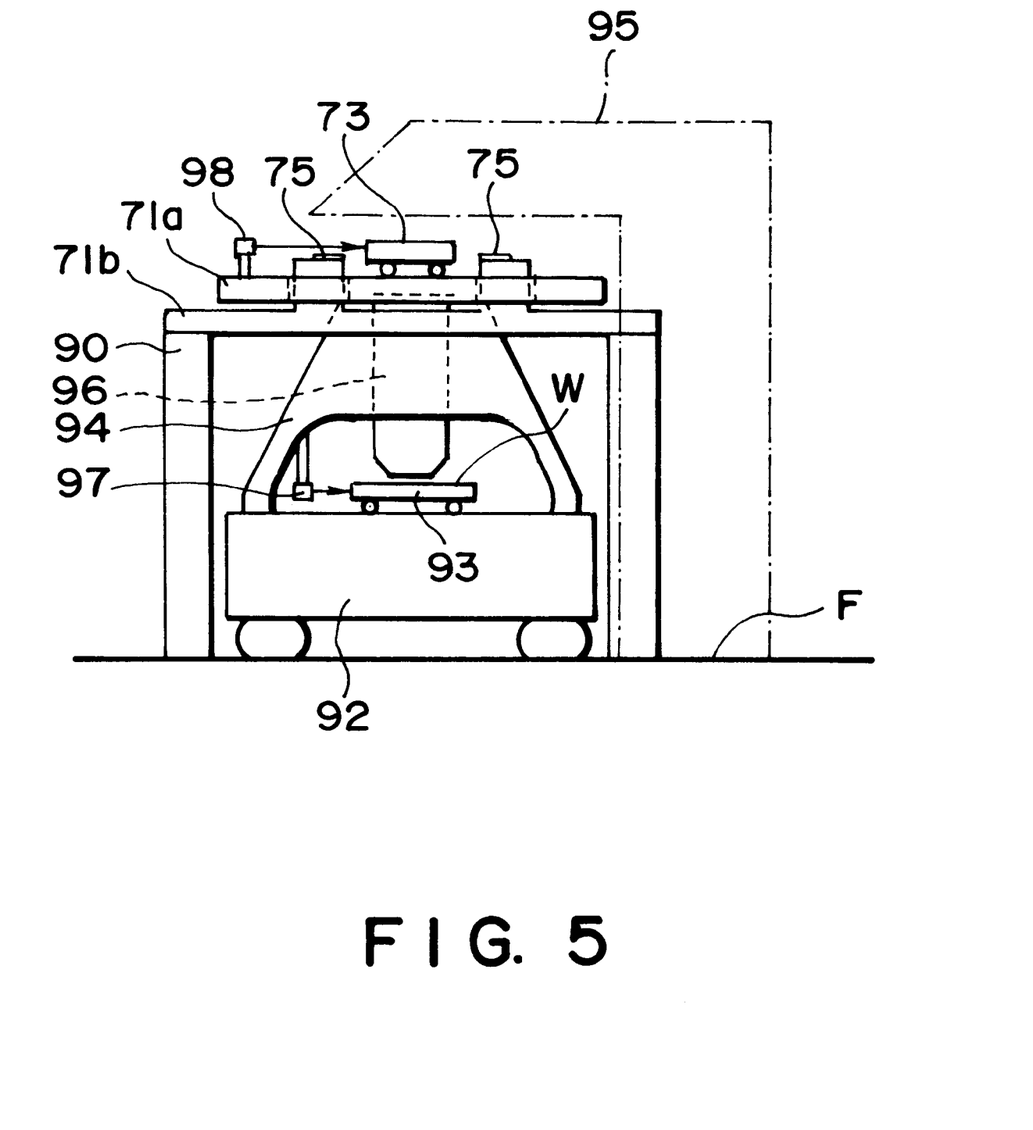
FIG. 5 is a schematic view of a stage system according to a second embodiment of the present invention.

Referring now to FIG. 5, an embodiment of a scanning exposure apparatus having a stage system according to the preceding embodiment incorporated as a reticle stage, will be described.

Exposure light, with which a wafer W on a wafer stage 93 is to be exposed through a reticle on a reticle stage 73, is produced by a light source device 95 (broken line).

Frame 94 supports a reticle stage base 71A, and also it supports a projection optical system 96 between the reticle stage 73 and the wafer stage 93.

The wafer stage 93 can be scanningly moved by driving means, in synchronism with the reticle stage 73. During the scan of the reticle stage 73 and the wafer stage 93, the positions of them are continuously detected by means of interferometers 97 and 98, respectively, and the results are fed back to the driving means for the reticle stage 73 and for the wafer stage 93, respectively. With this structure, the scan start positions of them can be synchronized with each other accurately and, additionally, the scan speed in the constant speed scanning region can be controlled at high precision.

In this embodiment, since a stage system according to the preceding embodiment wherein heat generation is suppressed is used as a reticle stage, the acceleration and deceleration speed can be made large. This effectively leads to an increase of throughput of the exposure apparatus. Further, because of low heat generation, distortion of the reticle can be reduced, which is very effective to high precision exposure.

Embodiment 3

Next, an embodiment of a semiconductor device manufacturing method using an exposure apparatus such as described above, will be explained.

Figure 6:
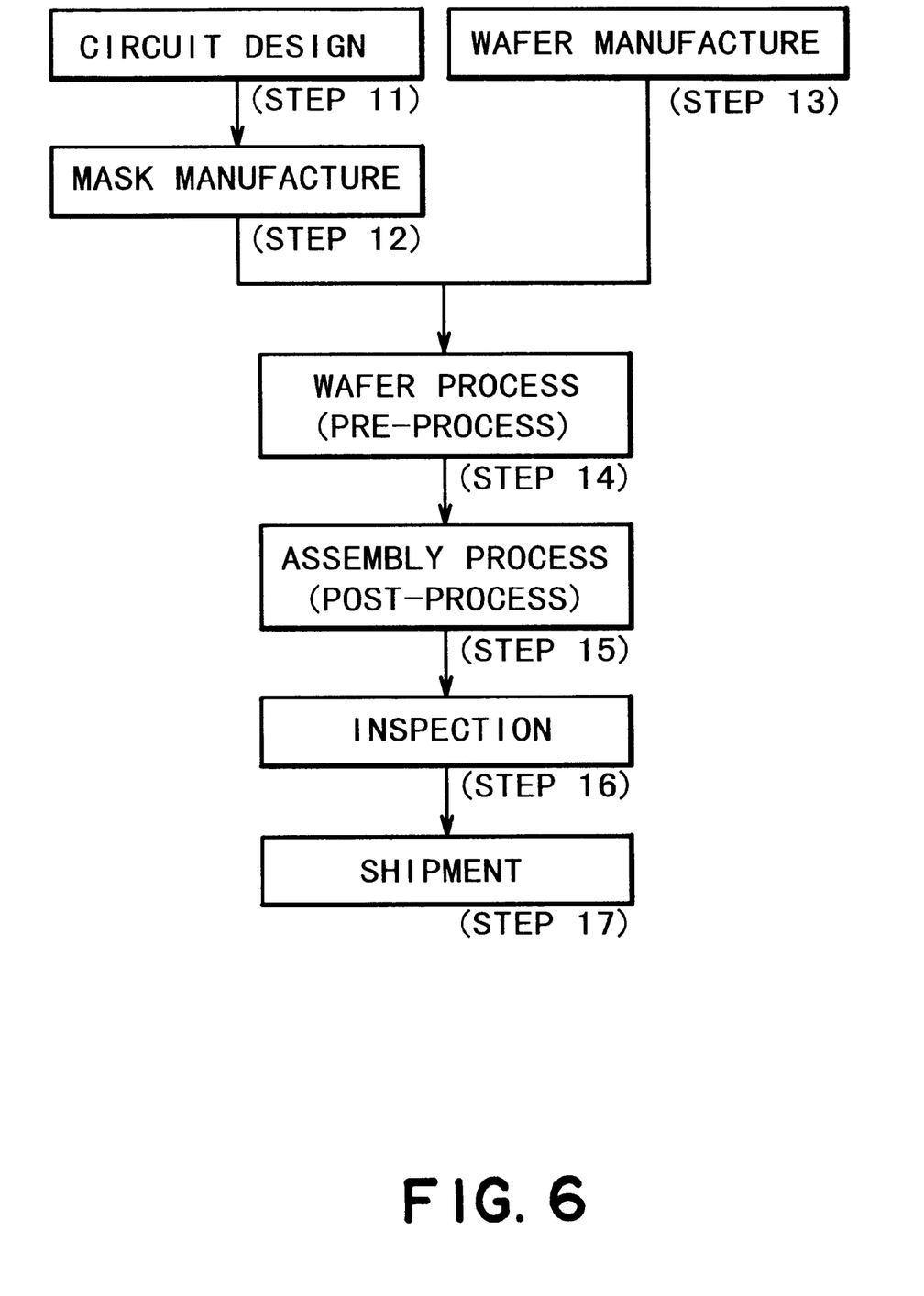
FIG. 6 is a flow chart of a semiconductor device manufacturing procedure.

FIG. 6 is a flow chart of a procedure for the manufacture of microdevices such as semiconductor chips (e.g., ICs or LSIs), liquid crystal panels, CCDs, thin film magnetic heads or micro-machines, for example.

Step S11 is a design process for designing a circuit of a semiconductor device. Step S12 is a process for making a mask on the basis of the circuit pattern design. Step S13 is a process for preparing a wafer by using a material such as silicon. Step S14 is a wafer process which is called a pre-process wherein, by using the so prepared mask and wafer, circuits are practically formed on the wafer through lithography. Step S15 subsequent to this is an assembling step which is called a post-process wherein the wafer having been processed by step S14 is formed into semiconductor chips. This step includes an assembling (dicing and bonding) process and a packaging (chip sealing) process. Step S16 is an inspection step wherein an operation check, a durability check and so on for the semiconductor devices provided by step S15, are carried out. With these processes, semiconductor devices are completed and they are shipped (step S17).

Figure 7:
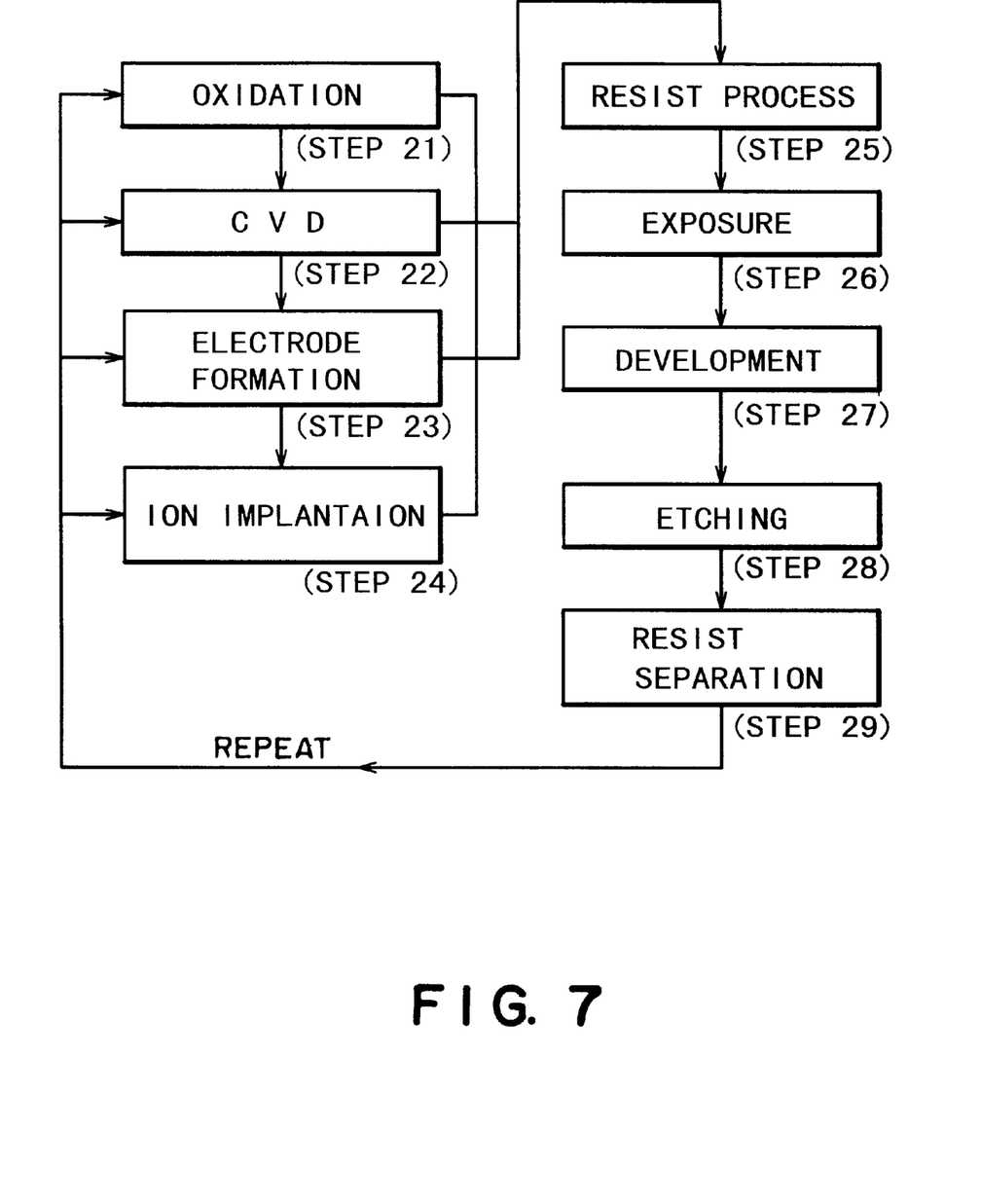
FIG. 7 is a flow chart of a wafer process.

FIG. 7 is a flow chart showing details of the wafer process. Step S21 is an oxidation process for oxidizing the surface of a wafer. Step S22 is a CVD process for forming an insulating film on the wafer surface. Step S23 is an electrode forming process for forming electrodes upon the wafer by vapor deposition. Step S24 is an ion implanting process for implanting ions to the wafer. Step S25 is a resist process for applying a resist (photosensitive material) to the wafer. Step S26 is an exposure process for printing, by exposure, the circuit pattern of the mask on the wafer through the exposure apparatus described above. Step S27 is a developing process for developing the exposed wafer. Step S28 is an etching process for removing portions other than the developed resist image. Step S29 is a resist separation process for separating the resist material remaining on the wafer after being subjected to the etching process. By repeating these processes, circuit patterns are supposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A stage system, comprising:

a stage movable along a path;

a first driving mechanism for accelerating or decelerating said stage on the basis of a resilience force of a resilient member;

a first holding mechanism for holding a resilience force being accumulated through compression of said resilient member of said first driving mechanism; and a second holding mechanism for holding a resilience force being accumulated through extension of said resilient member of said first driving mechanism.

2. A system according to claim 1, further comprising a second driving mechanism for applying a driving force to said stage.

3. A system according to claim 2, wherein said second driving mechanism serves to control one of position and speed of said stage.

4. A system according to claim 2, wherein said second driving mechanism serves to control one of position and speed of said stage in an acceleration region, a deceleration region and a constant speed region of said stage.

5. A system according to claim 2, wherein said second driving mechanism includes a linear motor.

6. A system according to claim 1, wherein said first driving mechanism includes a spring.

7. A system according to claim 1, wherein said first driving mechanism includes components disposed at opposite end portions of the path.

8. A system according to claim 1, wherein said first driving mechanism includes a pusher for contacting said stage to transmit the resilience force thereto.

9. A system according to claim 1, wherein said first and second holding mechanisms serve to release holding of said pusher at a desired timing.

10. A system according to claim 9, wherein said second holding mechanism serves t o release the holding so that, after release of the holding, said pusher and said stage contact at substantially the same speed.

11. A system according to claim 10, wherein said pusher and said stage contact at a position about a natural length of said resilient member compressed or extended.

12. A system according to claim 1, wherein each of said first and second holding mechanisms includes an electromagnetic clutch.

13. A system according to claim 1, further comprising a displacement mechanism for compressing or extending said resilient member to produce the resilience force.

14. A system according to claim 13, wherein said displacement mechanism includes a feed screw.

15. An exposure apparatus, comprising:

a stage movable along a path;

a first driving mechanism for accelerating or decelerating said stage on the basis of a resilience force;

a first holding mechanism for holding a resilience force being accumulated through compression by said first driving mechanism; and a second holding mechanism for holding a resilience force being accumulated through extension by said first driving mechanism.

16. An apparatus according to claim 15, wherein said stage serves to hold a reticle thereon and to scanningly move the reticle.

17. A device manufacturing method, comprising the steps of:

providing an exposure apparatus having (i) a stage movable along a path, (ii) a first driving mechanism for accelerating or decelerating said stage on the basis of a resilience force, (iii) a first holding mechanism for holding a resilience force being accumulated through compression by said first driving mechanism, and (iv) a second holding mechanism for holding a resilience force being accumulated through extension by said first driving mechanism; and transferring a pattern of a reticle onto a wafer.

18. A method according to claim 17, further comprising applying a resist to the wafer before exposure thereof, and developing the wafer after the exposure.

* * * * *

UNITED STATES PATENT AND TRADEMARK OFFICE
CERTIFICATE OF CORRECTION

PATENT NO. : 6,157,159           Page 1 of 1
DATED      : December 5, 2000
INVENTOR(S) : Nobushige Korenaga et al.

It is certified that error appears in the above-identified patent and that said Letters Patent is hereby corrected as shown below:

Title page,
At item [56] "Reference Cited" under "U.S. PATENT DOCUMENTS" "Korenage et al." should read -- Korenaga et al. --.

Column 5,
Line 48, "ma" should read -- m, --.

Column 8,
Line 54, "of" should read -- to --.

Column 9,
Line 13, "it s" should read -- its --.

Column 10,
Line 42, "the" (second occurrence) should read -- their --.
Line 43, of them" should be deleted.

Column 12,
Line 15, "t o" should read -- to --.

Signed and Sealed this

Eighteenth Day of December, 2001

Attest:

Attesting Officer

JAMES E. ROGAN
Director of the United States Patent and Trademark Office